(12) United States Patent
Zhu

(10) Patent No.: US 9,859,434 B2
(45) Date of Patent: Jan. 2, 2018

(54) SEMICONDUCTOR DEVICES AND METHODS FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: Institute of Microelectronics, Chinese Acadamy of Sciences, Beijing (CN)

( * ) Notice: Subject to any disclaimer, the term of this patent is extended or adjusted under 35 U.S.C. 154(b) by 74 days.

(21) Appl. No.: 14/914,246

(22) PCT Filed: Oct. 29, 2013

(86) PCT No.: PCT/CN2013/086122
§ 371 (c)(1),
(2) Date: Feb. 24, 2016

(87) PCT Pub. No.: WO2015/027561
PCT Pub. Date: Mar. 5, 2015

(65) Prior Publication Data
US 2016/0218218 A1    Jul. 28, 2016

(30) Foreign Application Priority Data
Aug. 30, 2013   (CN) .......................... 2013 1 0388631

(51) Int. Cl.
*H01L 29/78*    (2006.01)
*H01L 29/66*    (2006.01)

(52) U.S. Cl.
CPC .... *H01L 29/7855* (2013.01); *H01L 29/66795* (2013.01)

(58) Field of Classification Search
CPC ...................... H01L 29/66795; H01L 29/7855
See application file for complete search history.

(56) References Cited

U.S. PATENT DOCUMENTS 6,413,802 B1 *   7/2002   Hu .................. H01L 21/845
                                          257/E21.703
6,888,199 B2 *   5/2005   Nowak ............. H01L 21/84
                                          257/296

(Continued)

FOREIGN PATENT DOCUMENTS

CN          1770470 A          5/2006
CN          1988116 A          6/2007

(Continued)

OTHER PUBLICATIONS

Chinese Second Office Action (from Application No. 2013103886310), dated Jun. 2, 2017, 17 pages.

*Primary Examiner* — Earl Taylor
(74) *Attorney, Agent, or Firm* — Christensen, Fonder, Dardi & Herbert PLLC; John P. Fonder

(57) ABSTRACT

Semiconductor devices and methods for manufacturing the same are provided. An example semiconductor device may include: a Semiconductor on Insulator (SOI) substrate, including a base substrate, a buried dielectric layer and an SOI layer, an active area disposed on the SOI substrate and including a first sub-area and a second sub-area, wherein the first sub-area includes a first fin portion, the second sub-area includes a second fin portion opposite to the first fin portion, and at least one of the first sub-area and the second sub-area includes a laterally extending portion; a back gate arranged between the first fin portion and the second fin portion; back gate dielectric layers sandwiched between the back gate and the respective fin portions; and a gate stack formed on the active area.

16 Claims, 11 Drawing Sheets

(56) References Cited

U.S. PATENT DOCUMENTS

| | | | |
|---|---|---|---|
| 7,060,539 B2* | 6/2006 | Chidambarrao | H01L 29/66795 438/142 |
| 7,087,966 B1* | 8/2006 | Anderson | H01L 29/42384 257/213 |
| 7,091,566 B2* | 8/2006 | Zhu | H01L 29/785 257/318 |
| 7,411,214 B2* | 8/2008 | Chu | H01L 21/2807 257/288 |
| 7,456,471 B2* | 11/2008 | Anderson | H01L 29/41791 257/331 |
| 7,629,651 B2* | 12/2009 | Nakajima | H01L 29/7841 257/347 |
| 7,642,162 B2* | 1/2010 | Matsuo | H01L 29/41791 257/E21.585 |
| 7,902,000 B2* | 3/2011 | Anderson | H01L 29/66803 257/401 |
| 8,310,013 B2* | 11/2012 | Lin | H01L 29/045 257/401 |
| 8,405,164 B2* | 3/2013 | Hareland | H01L 29/1054 257/401 |
| 8,652,932 B2* | 2/2014 | Adam | H01L 29/66545 438/424 |
| 8,829,601 B2* | 9/2014 | Masuoka | H01L 29/66666 257/329 |
| 9,299,809 B2* | 3/2016 | Brunco | H01L 29/66795 |
| 9,450,100 B2* | 9/2016 | Zhu | H01L 29/66795 |
| 9,496,053 B2* | 11/2016 | Han | G11C 11/4076 |
| 2005/0073005 A1* | 4/2005 | Nowak | H01L 21/84 257/347 |
| 2005/0191795 A1* | 9/2005 | Chidambarrao | H01L 29/66795 438/142 |
| 2006/0076625 A1* | 4/2006 | Lee | H01L 29/7851 257/353 |
| 2006/0267111 A1* | 11/2006 | Anderson | H01L 29/42384 257/401 |
| 2007/0093010 A1* | 4/2007 | Mathew | H01L 21/82343 438/182 |
| 2007/0296014 A1* | 12/2007 | Nakajima | H01L 29/7841 257/308 |
| 2008/0061370 A1* | 3/2008 | Matsuo | H01L 29/41791 257/347 |
| 2008/0203491 A1* | 8/2008 | Anderson | H01L 29/66795 257/372 |
| 2008/0212366 A1* | 9/2008 | Ohsawa | G11C 11/404 365/182 |
| 2008/0251843 A1* | 10/2008 | Nakajima | H01L 27/108 257/347 |
| 2009/0108351 A1* | 4/2009 | Yang | H01L 27/108 257/347 |
| 2009/0206405 A1 | 8/2009 | Doyle et al. | |
| 2009/0209092 A1* | 8/2009 | Sonsky | H01L 29/6681 438/479 |
| 2010/0258871 A1* | 10/2010 | Ishigaki | H01L 29/66795 257/347 |
| 2011/0309333 A1* | 12/2011 | Cheng | B82Y 10/00 257/24 |
| 2012/0091538 A1* | 4/2012 | Lin | H01L 29/66795 257/401 |
| 2013/0102116 A1* | 4/2013 | Xiao | H01L 21/782 438/157 |
| 2013/0175621 A1* | 7/2013 | Chen | H01L 29/66787 257/347 |
| 2013/0264630 A1* | 10/2013 | Kim | H01L 29/7926 257/321 |
| 2013/0307025 A1* | 11/2013 | Pal | H01L 29/7831 257/192 |
| 2014/0346574 A1* | 11/2014 | Cai | H01L 29/66795 257/288 |
| 2015/0097244 A1* | 4/2015 | Liu | H01L 27/1211 257/351 |
| 2015/0171083 A1* | 6/2015 | Wang | H01L 27/0886 257/401 |
| 2015/0214372 A1* | 7/2015 | Hofmann | H01L 29/7855 257/392 |
| 2015/0340438 A1* | 11/2015 | Zhu | H01L 29/78648 257/77 |
| 2015/0357350 A1* | 12/2015 | Zhu | H01L 29/66795 257/347 |
| 2015/0364605 A1* | 12/2015 | Zhu | H01L 29/66795 257/365 |
| 2016/0104801 A1* | 4/2016 | Zhu | H01L 29/66795 365/185.25 |
| 2016/0218218 A1* | 7/2016 | Zhu | H01L 29/7855 |

FOREIGN PATENT DOCUMENTS

| | | |
|---|---|---|
| CN | 101079434 A | 11/2007 |
| CN | 102456579 A | 5/2012 |

* cited by examiner

SEMICONDUCTOR DEVICES AND METHODS FOR MANUFACTURING THE SAME

CROSS-REFERENCE TO RELATED APPLICATION(S)

This application is a U.S. national phase application of PCT Application No. PCT/CN2013/086122, entitled "SEMICONDUCTOR DEVICES AND METHODS FOR MANUFACTURING THE SAME," which was filed on Oct. 29, 2013 and claimed priority to Chinese Application No. 201310388631.0, filed on Aug. 30, 2013. Both the PCT Application and the Chinese Application are incorporated herein by reference in their entireties.

TECHNICAL FIELD

The present disclosure relates to the semiconductor field, and particularly, to semiconductor devices with advantages of both SOI (Semiconductor on Insulator) devices and FinFET (Fin Field Effect Transistor) devices and methods for manufacturing the same.

BACKGROUND

In order to cope with challenges caused by continuous scaling down of semiconductor devices, such as short channel effects etc., a variety of high-performance devices have been proposed, e.g., SOI devices, FinFETs, and the like.

The SOI devices can suppress the short channel effects due to BOX (Buried Oxide) therein. Further, FD (Fully Depleted) SOI devices can be achieved by the ET-SOI (Extremely Thin-Semiconductor on Insulator) technology. However, SOI including ET-SOI is more expensive and has limited performances.

The FinFET is a three-dimensional device, comprising a fin formed vertically on a substrate, with a channel defined in the fin. The fin may have its height raised without increasing its footprint, resulting in increased current drive capability per unit footprint. However, fins generally have substantially uniform heights across a wafer, and are difficult to be adjusted separately. Thus, it is difficult to separately adjust the drive capability of individual devices in an integrated circuit formed on the wafer.

SUMMARY

In view of the foregoing, the present disclosure aims to provide, among others, semiconductor devices and methods for manufacturing the same.

According to an aspect of the present disclosure, a semiconductor device is provided. The semiconductor device may comprise: a Semiconductor on Insulator (SOI) substrate, including a base substrate, a buried dielectric layer and an SOI layer; an active area disposed on the SOI substrate and including a first sub-area and a second sub-area, wherein the first sub-area comprises a first fin portion, the second sub-area comprises a second fin portion opposite to the first fin portion, and at least one of the first sub-area and the second sub-area comprises a laterally extending portion; a back gate arranged between the first fin portion and the second fin portion; back gate dielectric layers sandwiched between the back gate and the respective fin portions; and a gate stack formed on the active area.

According to another aspect of the present disclosure, a method for manufacturing a semiconductor device is provided. The method may comprise: forming an active area on a Semiconductor on Insulator (SOI) substrate, wherein the SOI substrate comprises a base substrate, a buried dielectric layer and an SOI layer; forming a back gate trench passing through the active area, to divide the active area into a first sub-area and a second sub-area; forming back gate dielectric layers on side walls of the back gate trench; filling the back gate trench with a conductive material to form a back gate; patterning the active area, so as to form a first fin portion in the first sub-area and a second fin portion in the second sub-area respectively, and to form a laterally extending portion in at least one of the first sub-area and the second sub-area, wherein the first fin portion and the second fin portion are arranged on the opposite side walls of the back gate trench respectively; and forming a gate stack on the patterned active area.

According to embodiments of the present disclosure, the active area may comprise the laterally extending portion and the fin portions. On one hand, advantages like those in FinFETs may be achieved due to the fin portions, e.g., increasing device gain per unit footprint. On the other hand, a channel width of the device may be relatively easily adjusted by the laterally extending portion.

BRIEF DESCRIPTION OF THE DRAWINGS

The above and other objects, features, and advantages of the present disclosure will become more apparent from following descriptions on embodiments thereof with reference to attached drawings, in which.

DETAILED DESCRIPTION

Figure 1:
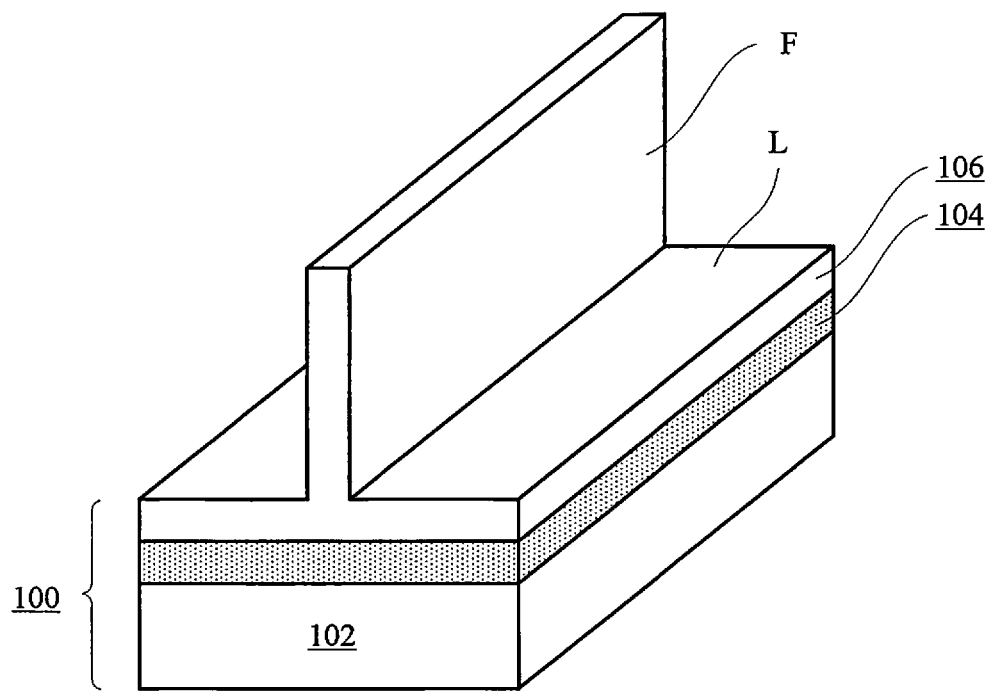
FIG. 1 is a perspective view showing an arrangement of an active area according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, a semiconductor device is provided. The semiconductor device may comprise an SOI (Semiconductor on Insulator) substrate. The SOI substrate may comprise a base substrate (e.g., Si), a buried dielectric layer (e.g., buried oxide BOX) and an SOI layer (e.g., Si) stacked in sequence. In an example, the SOI substrate comprises an ET (Extremely Thin)-SOI substrate.

The semiconductor device may further comprise an active area disposed on the SOI substrate. The active area may comprise a laterally extending portion which laterally extends along a surface of the substrate, and also a fin portion which extends along a direction substantially perpendicular to the surface of the substrate. For example, the laterally extending portion may be disposed at the bottom of the fin portion, and extend to either one or both sides of the fin portion towards a direction away from the fin portion. Thus, the active area may substantially present a shape of, for example, "⏌," "⎿" "⊥" etc. The fin portion may function as a fin in a FinFET, while the laterally extending portion may function as an active area in an SOI device.

For example, the fin portion may be formed at least partially from additional (one or more) semiconductor layers formed (e.g. by epitaxy) on the SOI layer. This or these additional semiconductor layers may be patterned to extend in a fin-like shape, just like a fin in a FinFET. The laterally extending portion may be formed at least partially from the SOI layer.

The semiconductor device may further comprise a gate stack formed on the active area. The gate stack defines a channel region (corresponding to portions of the active area overlapped with the gate stack) in the active area, and thus defines source/drain regions (corresponding to portions of the active area on opposite sides of the channel region). Therefore, the channel region has its width substantially determined by a height of the fin portion and a lateral extent of the laterally extending portion (hereinafter referred to as a width of the laterally extending portion). For example, the width of the laterally extending portion may be defined by an isolation portion such as STI (Shallow Trench Isolation). Thus, the channel width of the device may be relatively easy to be adjusted.

In an example, the active area may comprise a first sub-area and a second sub-area opposite to each other. The semiconductor device may further comprise a back gate arranged between the first sub-area and the second sub-area and back gate dielectric layers sandwiched between the back gate and the respective fin portions.

The first sub-area and second sub-area may comprise a first fin portion and a second fin portion opposite to each other, respectively. Thus, the back gate and the back gate dielectric layers may be arranged between the first fin portion and the second fin portion opposite to each other. As a result, the first fin portion and the second fin portion and the back gate sandwiched between them form a sandwich Fin (sFin) structure. The fin portions may be controlled by applying a bias to the back gate. Additionally, at least one of the first sub-area and the second sub-area may comprise a laterally extending portion. Thus, each of the sub-areas may substantially present a shape of, for example, "⏌," "⎿," "⎸" etc.

In a case where the back gate is formed and the gate stack crosses over the active area, the semiconductor may further comprise a dielectric layer formed on the back gate for isolating the back gate from the gate stack.

According to an embodiment of the present disclosure, the back gate may pass through the buried dielectric layer to electrically contact with the base substrate. As such, the bias may be applied to the back gate through the base substrate. In order to improve an efficiency of applying the bias, a well region may be formed in the base substrate, so that the back gate electrically contacts with the well region. The bias may be applied to the back gate through an electrical contact to the well region.

According to some examples, in order to improve performances of the device, the strained source/drain technique may be applied. For example, a further semiconductor layer may be grown on the source/drain regions, so as to apply stress to the channel region. For example, compressive stress may be applied for a p-type device; while tensile stress may be applied for an n-type device.

According to an embodiment of the present disclosure, the semiconductor device may be manufactured as follows. For example, an active area may be disposed on an SOI substrate. The active area may be formed by an SOI layer of the SOI substrate, or by further growing additional (one or more) semiconductor layers on the SOI layer (especially for a case of an ET-SOI substrate). Adjacent semiconductor layers may have etching selectivity with respect to each other, e.g., due to different materials of them, so as to facilitate patterning of them.

The disposed active area (the SOI layer, or a combination of the SOI layer and the formed additional semiconductor layer(s)) may be patterned, to comprise a laterally extending portion laterally extending along a surface of the substrate and a fin portion extending in a direction substantially perpendicular to the surface of the substrate. Then, a gate stack may be formed on the patterned active area.

For example, the active area may be patterned as follows. A mask layer in a stripe shape may be formed on the active area. Then, the mask may be used for etching the active area. The etching may stop before arriving at the bottom of the active area, but with a thin layer left, which may be used as the laterally extending portion later. For example, in a case where the additional semiconductor layer(s) is formed, the etching may stop at the SOI layer, and thus the SOI layer is remained. It is also feasible that the etching stops at some semiconductor layer above the SOI layer (in which case a relatively thick laterally extending portion may be obtained), or enters into the SOI layer (in which case a relatively thin laterally extending portion may be obtained). Portions of the active area under the stripe-type mask layer may be used as the fin portion later. If the stripe-type mask is located at an edge of the active area, the patterned active area may present a shape of, for example, "⏌" or "⎿;" while if the stripe type of mask is located in the substantially middle of the active area, the patterned active area may present a shape of, for example, "⊥."

An isolation portion such as STI may be formed on the SOI substrate, so as to define the active area horizontally and thus to define the width of the laterally extending portion. The width of the laterally extending portion may be adjusted by adjusting the position of the isolation portion, so as to adjust the channel width of the device.

In an example, a back gate trench may be formed in (e.g. the substantially middle of) the active area to pass through the active area, possibly to divide the active area into a first sub-area and a second sub-area. Further, the back gate trench may further extend to pass through the buried dielectric layer. A back gate may be formed by filling the back gate trench with a conductive material, such as metal or doped semiconductor (e.g. polysilicon). Furthermore, back gate dielectric layers may be formed on side walls of the back gate trench, prior to filling the back gate trench. In an example, the back gate dielectric layers may be manufactured in a spacer formation process, thereby the process may be simplified.

In order to facilitate patterning of the back gate trench and the fins, according to an example, a patterning assisting layer may be formed on the active area. The patterning assisting layer may be patterned to have an opening corresponding to the back gate trench. A pattern transfer layer (corresponding to the stripe-type mask layer as described above) may be formed on side walls of the patterning assisting layer facing the opening. As such, the back gate trench may be patterned with the patterning assisting layer and the pattern transfer layer as a mask (hereinafter referred to as "a first patterning"). Further, the active region may be patterned with the pattern transfer layer as a mask (hereinafter referred to as "a second patterning").

As such, the patterning of the active area, especially the fin portion, is performed in two steps: the first patterning in which one side of the fin portion is formed, and the second patterning in which the other side of the fin portion is formed. In the first patterning, the fin portion is still connected to and thus supported by the body of the active area. Furthermore, in the second patterning, the fin portion is connected to and thus supported by the back gate. As a result, it is possible to prevent the fin portion from collapsing during manufacture, and thus to make the fin portion thinner at a high yield.

Before the second patterning, a dielectric layer may be formed in the back gate trench to cover the back gate. The dielectric layer may electrically isolate the back gate (from e.g. the gate stack). On the other hand, the dielectric layer may prevent the second patterning from affecting the back gate.

Further, in an example, the pattern transfer layer may be formed on the side walls of the patterning assisting layer in a spacer formation process, in order to facilitate the patterning. Since the spacer formation process needs no mask, the number of masks used in the process may be reduced.

Moreover, before forming the patterning assisting layer, a stop layer may be further formed on the active area. The patterning of the patterning assisting layer (to form the opening therein) may stop at the stop layer. For example, the pattern transfer layer may comprise nitride (e.g., silicon nitride), and the stop layer may comprise oxide (e.g., silicon oxide).

The technology of the present disclosure can be implemented in various ways, some of which are exemplified in the following with reference to the drawings.

FIG. 1 is a perspective view showing an arrangement of an active area according to an embodiment of the present disclosure.

As shown in FIG. 1, an SOI substrate 100 may be provided. The SOI substrate 100 may comprise a base substrate 102 (e.g., silicon), a buried dielectric layer (e.g., oxide) 104 arranged on the base substrate 102, and an SOI layer 106 (e.g., silicon) arranged on the buried dielectric layer. It is to be understood that the substrate is not limited to silicon system materials, but may comprise materials based on other semiconductor, e.g. Ge system materials etc. Hereinafter, the silicon system materials may be taken as an example for illustration.

The active area is arranged on the SOI substrate 100. The active area may comprise a laterally extending portion L which laterally extends along a surface of the substrate, and a fin portion F which extends along a direction substantially perpendicular to the surface of the substrate. In this example, the laterally extending portion L is located at the bottom of the fin portion F, and extends to opposite sides of the fin portion F towards a direction away from the fin portion F. The laterally extending portion L may have a width defined by an isolation portion as described below, and a thickness of e.g. about 5-15 nm. The fin portion F may have a height (from a top surface of the laterally extending portion L to a top surface of the fin portion F) of e.g. about 10 nm-150 nm, and a width of e.g. about 2-20 nm.

In this example, L and F are shown as being formed from the SOI layer 106. However, the present disclosure is not limited thereto. For example, the active area, especially the fin portion F, may comprise additional semiconductor layer(s).

Furthermore in this example, F is located in the substantially middle of L, and thus the active area presents a shape of "⊥." However, the present disclosure is not limited to this. For example, F may be offset from the middle of L. Additionally, when F is located at an edge of the L, the active area may present a shape of, for example, "⌐" or "⌊."

Figure 2:
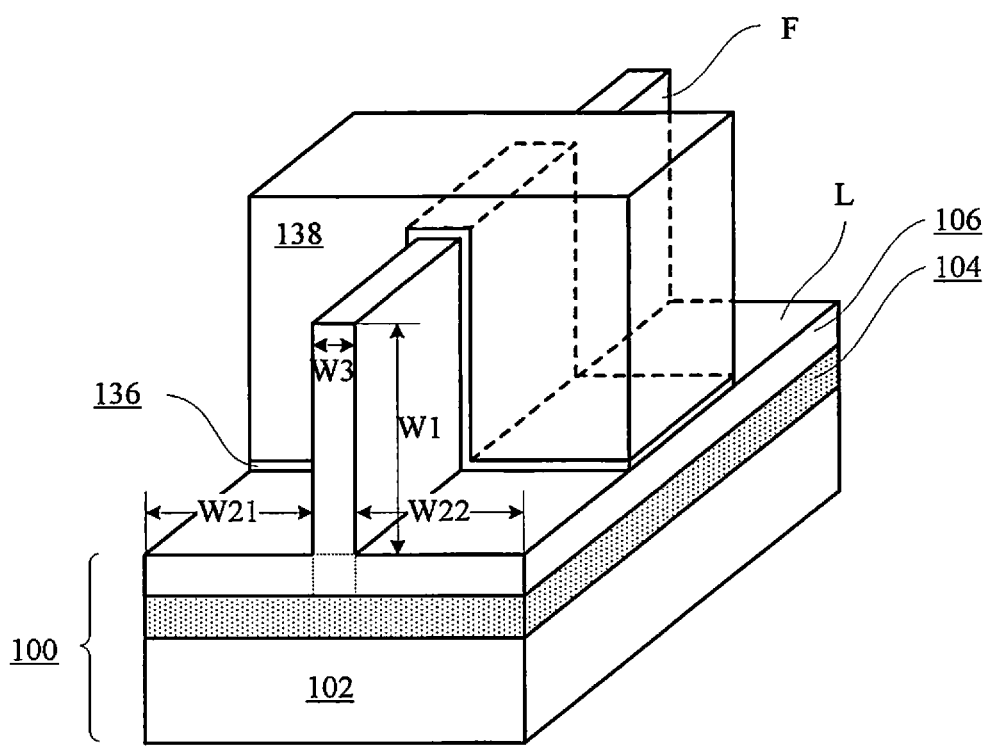
FIG. 2 is a perspective view showing a semiconductor device obtained by forming a gate stack on the active area of FIG. 1 according to an embodiment of the present disclosure.

A gate stack may be formed on the active area shown in FIG. 1, resulting in a semiconductor device as shown in FIG. 2. The gate stack may comprise a gate dielectric layer 136 and a gate conductor layer 138. For example, the gate dielectric layer 136 may comprise high-K gate dielectric such as $HfO_2$ with a thickness of about 1-5 nm, and the gate conductor layer 138 may comprise a metal gate conductor. Further, the gate dielectric layer 136 may comprise a thin layer of oxide (on which the high-K gate dielectric is formed) with a thickness of about 0.3-1.2 nm. A work function adjustment layer (not shown) may be further formed between the gate dielectric layer 136 and the gate conductor layer 138. Additionally, a gate spacer (not shown) may be formed on side walls of the gate stack. For example, the gate spacer may comprise nitride with a thickness of about 5-15 nm.

Due to presence of the gate stack, a channel region (corresponding to portions of the active area overlapped with the gate stack) and thus source/drain regions (corresponding to portions of the active area on opposite sides of the channel region) are defined in the active area. The source/drain regions may be formed by e.g. ion implantation into the active area. Here, the channel region may have a width substantially determined by the height of the fin portion F and the width of the laterally extending portion L. For example, in this example, the width of the channel substantially corresponds to $(2W1+W3)+(W21+W22)$. When calculating the width of the channel, a section where the fin portion F intersects with the laterally extending portion L (as shown in FIG. 2 by dotted block) is not regarded as a part of the channel region, because this section has substantially no contribution to channel current. As to be described below, the width of the channel may be relatively easy to be adjusted by adjusting the width (e.g., W21 and/or W22) of the laterally extending portion L.

In the example of FIG. 2, the gate stack is shown as crossing over the fin portion F, and thus the gate stack intersects with three side surfaces of the fin portion F. That's why "2×W1+W3" is used in calculating the width of the channel as illustrated above. However, the present disclosure is not limited thereto. For example, the gate stack may be formed on opposite sides of the fin portion F, and thus intersects with the top surface of the laterally extending portion L and the side wall of the fin portion F on each side, but without intersecting with the top surface of the fin portion F. In this case, the width of the channel may substantially correspond to 2×W1+(W21+W22). Here, the term "2×W1" represents that the channel is formed at the two side surfaces of the fin portion F, but is not formed on the top surface of the fin portion F. However, the width of the channel is not limited to this specific form, but may depend on the manner in which the gate stack intersects with the active area.

Figure 3:
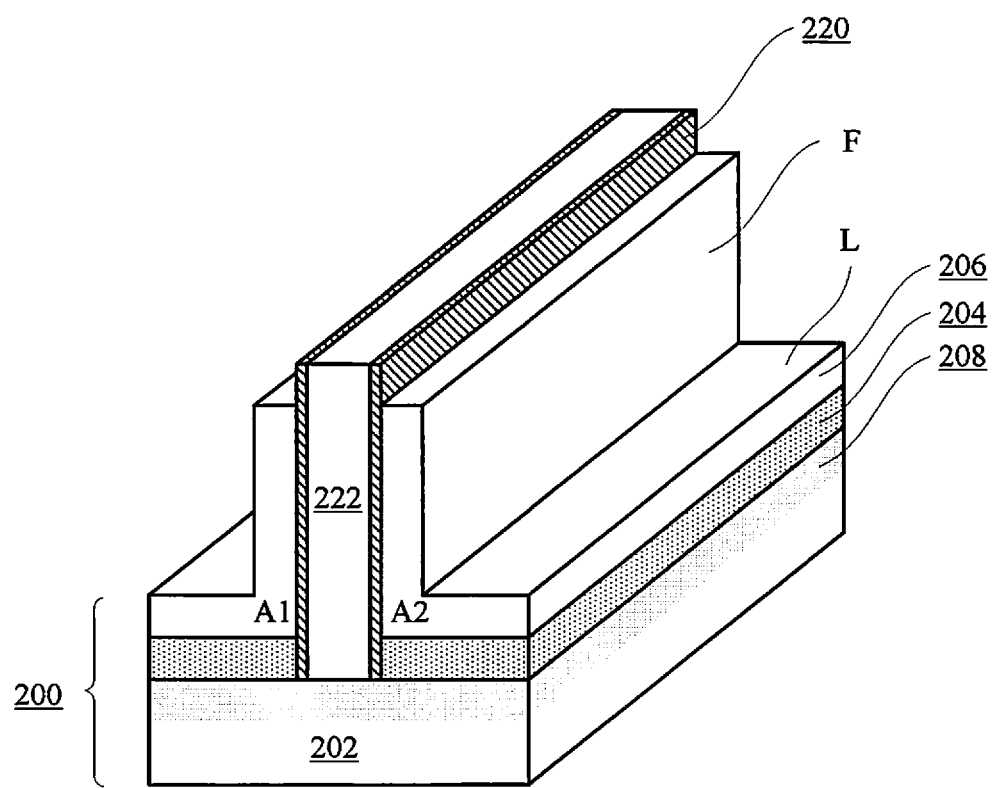
FIG. 3 is a perspective view showing an arrangement of an active area according to another embodiment of the present disclosure.

FIG. 3 is a perspective view showing an arrangement of an active area according to another embodiment of the present disclosure.

As shown in FIG. 3, an SOI substrate 200 may be provided. Likewise, the SOI substrate 200 may comprise a base substrate 202, a buried dielectric layer 204 arranged on the base substrate 202, and an SOI layer 206 arranged on the buried dielectric layer. The active area is disposed on the SOI substrate 200. In this example, the active area may comprise a first sub-area A1 and a second sub-area A2. The first sub-area A1 and the second sub-area A2 may each have a laterally extending portion L and a fin portion F. For structural and material parameters of these features, reference may be made to the above descriptions in conjunction with FIG. 1.

A back gate 222 may be sandwiched between the first sub-area A1 and the second sub-area A2. The back gate 222 may have its top surface substantially flush with or higher than that of the fin portion F. The back gate 222 may be separated from the active area by back gate dielectric layers 220. The back gate dielectric layers 220 may comprise various suitable dielectric materials, e.g. oxide (e.g., silicon oxide) or high-K dielectric material such as $HfO_2$, with a thickness of e.g. about 2-25 nm. The back gate 222 may comprise various suitable conductive materials, such as TiN, W or a combination thereof, with a width of e.g. about 5-30 nm. Alternatively, the back gate 222 may comprise a doped (and thus conductive) semiconductor material such as polysilicon, at a polarity (p-type or n-type) which can be selected for adjusting a threshold voltage of the device. The back gate 222 may pass through the buried dielectric layer 204 to electrically contact with the base substrate 202. Thus, a bias may be applied to the back gate 222 via the base substrate 202. For this purpose, a well region 208 may be included in the base substrate 202, so as to enhance the electrical contact with the back gate 222.

In the example of FIG. 3, the first sub-area A1 and the second sub-area A2 may each comprise the laterally extending portion L and the fin portion F. Their respective fin portions F may be opposite to each other to sandwich the back gate between them. However, the present disclosure is not limited to this. For example, one of the first sub-area A1 and the second sub-area A2 may comprise only the fin portion F, while the other may comprise both the laterally extending portion L and the fin portion F. That is, each of the first sub-area A1 and the second sub-area A2 may substantially present a shape of, for example, "⌐," "⌐," or "|."

Figure 4A:
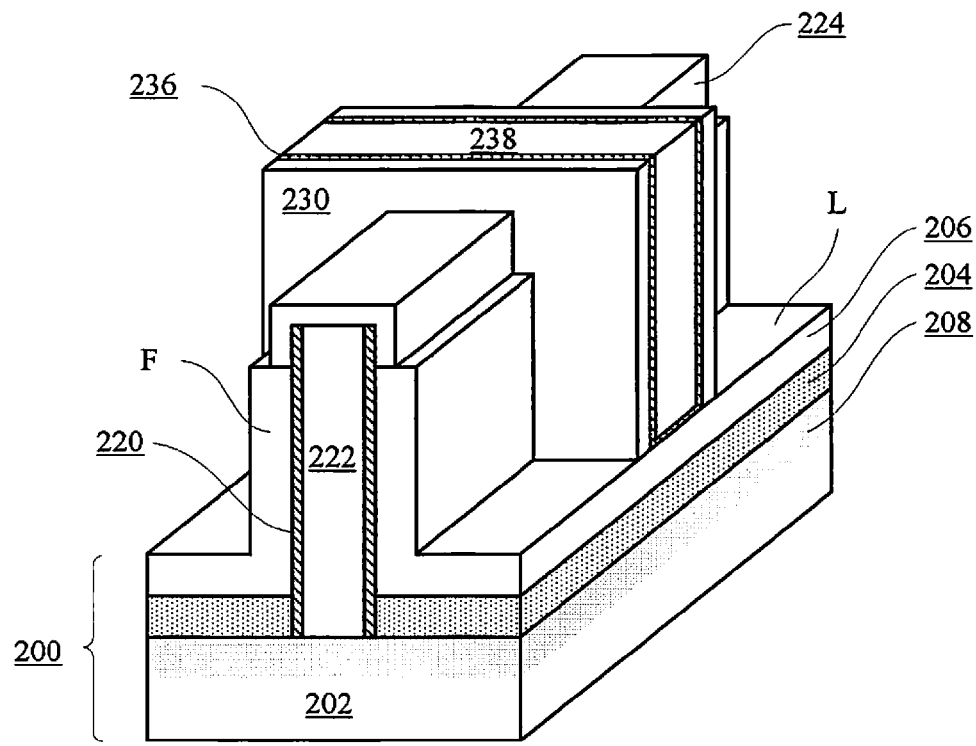
FIG. 4 (a) is a perspective view showing a semiconductor device obtained by forming a gate stack on the active area of FIG. 3 according to an embodiment of the present disclosure, and FIG. 4 (b) is a perspective view showing the semiconductor device of FIG. 4 (a) which is cut off along a middle line.
Figure 4B:
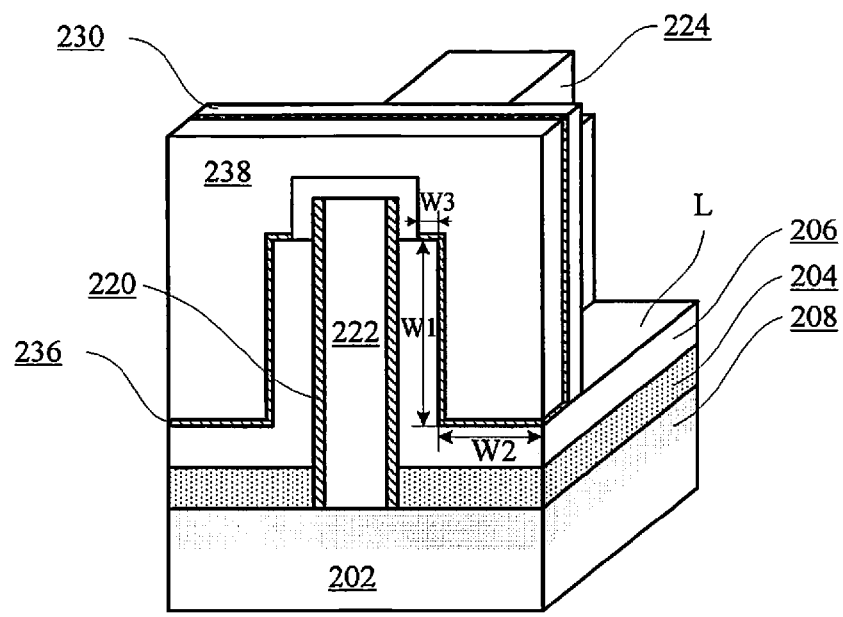

A gate stack may be formed on the active area shown in FIG. 3, resulting in a semiconductor device as shown in FIGS. 4(a) and 4(b). Likewise, the gate stack may comprise a gate dielectric layer 236 and a gate conductor layer 238. A gate spacer 230 may be formed on side walls of the gate stack. For detailed description thereof, reference may be made to the above descriptions in conjunction with FIG. 2.

In the embodiment, the gate stack also crosses over the active area (and the back gate). Here, a dielectric layer 224 (e.g. nitride) may be arranged on the back gate, so as to electrically isolate the gate stack from the back gate. It should be noted that FIGS. 4(a) and 4(b) only illustratively show shapes of the dielectric layer 224 and the gate dielectric layer 236 (especially shapes of portions thereof near the top of the fin portion F and the back gate 222), and their particular shapes depend on the manufacture process. As described above, it is also feasible that the gate stack does not cross over the active area (and the back gate).

Likewise, a channel width is mainly determined by a height of the fin portion F and a width of the laterally extending portion L. For example, in this example, the channel width in the second sub-area A2 substantially corresponds to (W1+W2+W3). The channel width in the first sub-area A1 may be calculated similarly. As described above, the channel width may be relatively easy to be adjusted by adjusting the width (e.g. W2) of the laterally extending portion L in the first sub-area A1 and/or the second sub-area A2. It should be noted that the width (W3) of the channel on the top surface of the fin portion F depends on the manner in which the gate stack intersects with the top surface of the fin portion F. W3 may be in a range from 0 (e.g., a case where the gate stack and the top surface of the fin portion F has a dielectric layer sandwiched between them and thus are isolated from each other) and an entire width of the top surface of the fin portion F (e.g., a case where the gate stack intersects with the entire top surface of the fin portion F).

FIGS. 5-19 are schematic views showing various phrases in a flow of manufacturing a semiconductor device according to another embodiment of the present disclosure.

Figure 5:
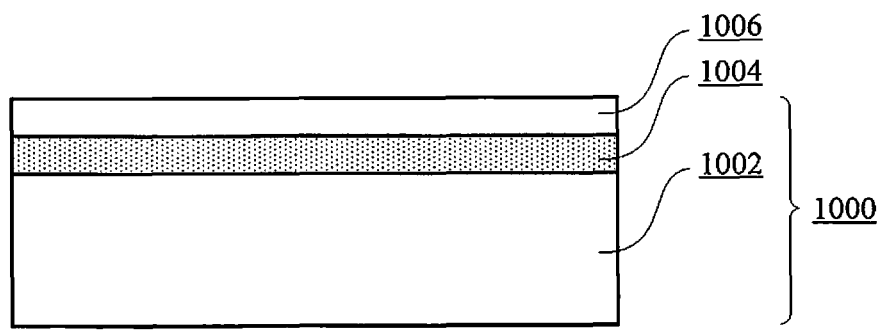
FIGS. 5-19 are schematic views showing various phrases in a flow of manufacturing a semiconductor device according to another embodiment of the present disclosure.

As shown in FIG. 5, an SOI substrate 1000 is provided. The SOI substrate 1000 may comprise a base substrate 1002 (e.g., silicon), a buried dielectric layer 1004 (e.g., oxide) and an SOI layer 1006 (e.g., silicon). Here, the SOI substrate 1000 may comprise an ET-SOI substrate. In a case of ET-SOI, the SOI layer 1006 may have a thickness of about 5-15 nm, and the buried dielectric layer 1004 may have a thickness of about 3-30 nm, for example.

Figure 6:
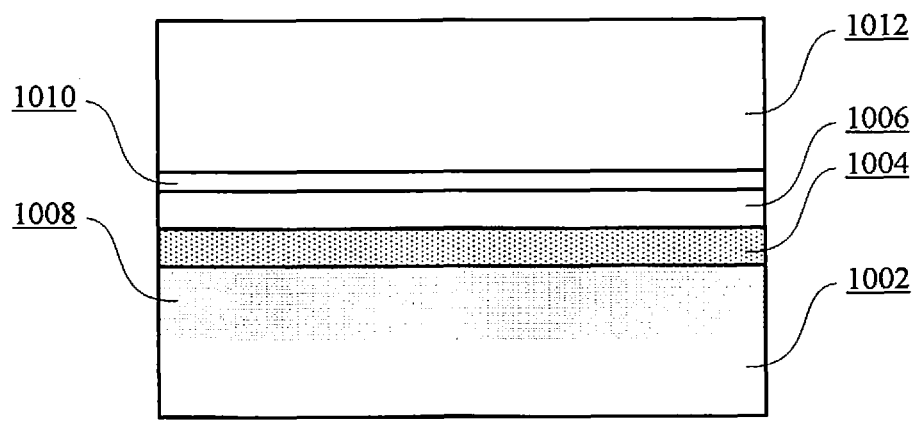

In the base substrate 1002, a well region 1008 (as shown in FIG. 6) may be formed by e.g. ion implantation. For example, an n-type well region may be formed for a p-type device; while a p-type well region may be formed for an n-type device. For example, the n-type well region may be formed by implanting n-type impurities such as P or As into the substrate 1000, and the p-type well region may be formed by implanting p-type impurities such as B into the substrate 1000. If required, annealing may be performed after the implantation. Those skilled in the art can contemplate various ways to form the n-type well and the p-type well, and thus detailed descriptions thereof are omitted here.

Next, an active area may be defined on the SOI substrate. In this example as shown in FIG. 6, a first semiconductor layer 1010 and a second semiconductor layer 1012 may be sequentially formed on the SOI substrate by, e.g., epitaxy. The first semiconductor layer 1010 may have a semiconductor material different from that of the second semiconductor layer 1012 and SOI layer 1006 adjacent thereto, and thus have etching selectivity with respect to them. For example, the first semiconductor layer may comprise SiGe (with an atomic percentage of Ge of about 5-20%), with a thickness of about 5-15 nm. The second semiconductor layer may comprise Si, whose thickness may be determined according to a height of a fin portion to be formed. However, the materials of the first semiconductor layer and the second semiconductor layer are not limited thereto. Those skilled in the art can contemplate various suitable semiconductor materials, as long as they can provide suitable etching selectivity.

Furthermore, the arrangement of the active area is not limited to forming two semiconductor layers as described above. More or less semiconductor layers may be formed, or even no semiconductor layer is formed (but using the SOI layer instead, especially for a case of a relatively thick SOI layer).

Figure 7:
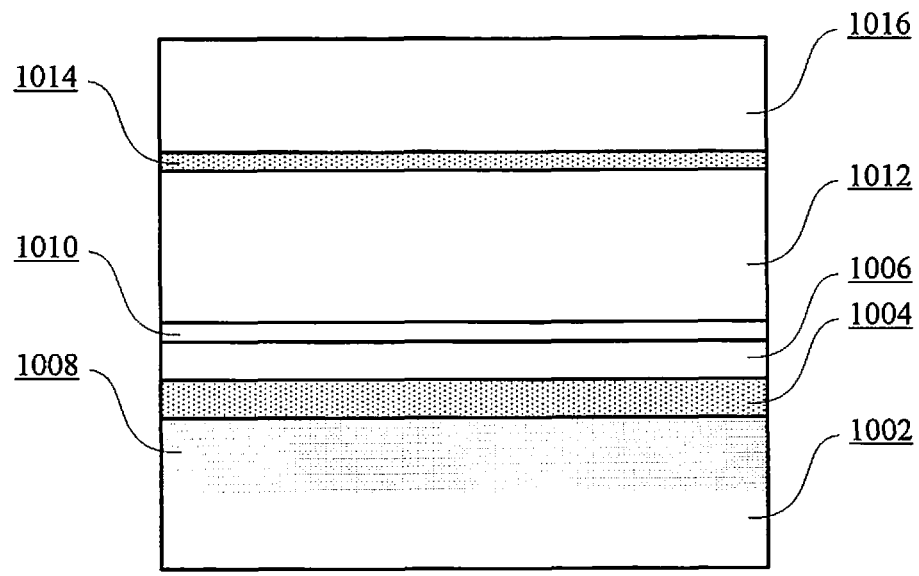

Then, as shown in FIG. 7, a stop layer 1014 and a patterning assisting layer 1016 may be sequentially formed on the active area by, e.g., deposition. For example, the stop layer 1014 may comprise oxide (e.g. silicon oxide), with a thickness of about 5-20 nm. The patterning assisting layer 1016 may comprise amorphous silicon, with a thickness of about 50-200 nm. The materials of these layers are selected to provide etching selectivity in subsequent processes. It should be appreciated by those skilled in the art that these layers may comprise other suitable materials, and some of the layers may be even omitted in some cases. After the patterning assisting layer 1016 is formed, it may be planarized by, e.g., CMP (Chemical Mechanical Polishing).

Figure 8:
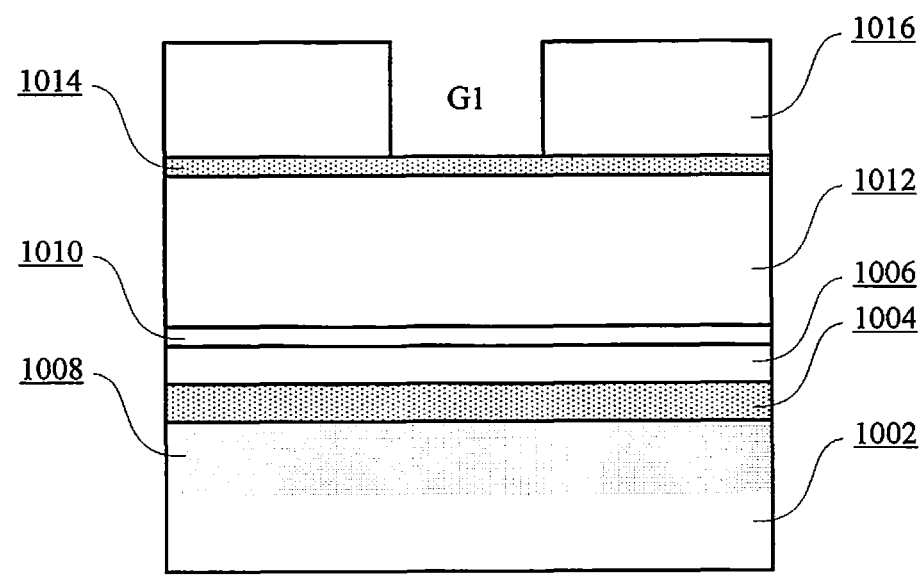

Next, photoresist (not shown) may be formed on the patterning assisting layer 1016. The photoresist may be patterned by, e.g., photolithography, so as to form an opening corresponding to a back gate to be formed. Then, the patterning assisting layer 1016 may be etched by, e.g., RIE (Reactive Ion Etching), with the photoresist as a mask, so as to form an opening G1 in the patterning assisting layer 1016, as shown in FIG. 8. The opening G1 may have a width of e.g. about 15-100 nm. The etching may stop at the stop layer 1014. If there is sufficient etching selectivity between the patterning assisting layer 1016 and the underlying active area (in this example, the second semiconductor layer 1012), such a stop layer 1014 may be even omitted. Then, the photoresist may be removed.

Figure 9:
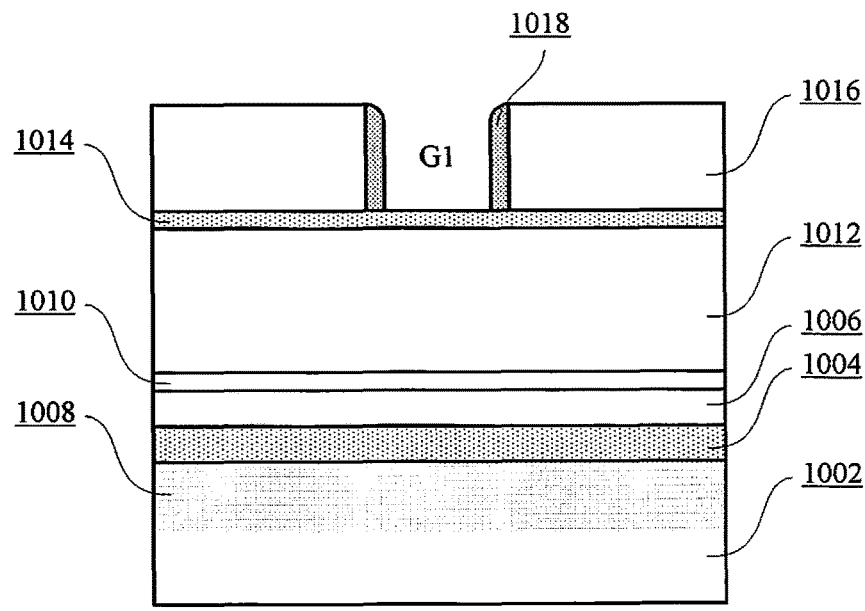

Then, as shown in FIG. 9, a pattern transfer layer 1018 may be formed on side walls of the patterning assisting layer 1016 (facing the opening). The pattern transfer layer 1018 may be manufactured in a spacer formation process. For example, a layer of nitride may be deposited on a surface of the structure as shown in FIG. 8, and then RIE may be performed on the nitride to form the pattern transfer layer as spacer. The deposited nitride layer may have a thickness of about 2-20 nm (which substantially determines a width of the fin portion to be formed subsequently). The depositing may be performed by, e.g., ALD (atomic layer deposition). Those skilled in the art know various ways to form such a spacer, and detailed descriptions thereof thus will be omitted.

Figure 10:
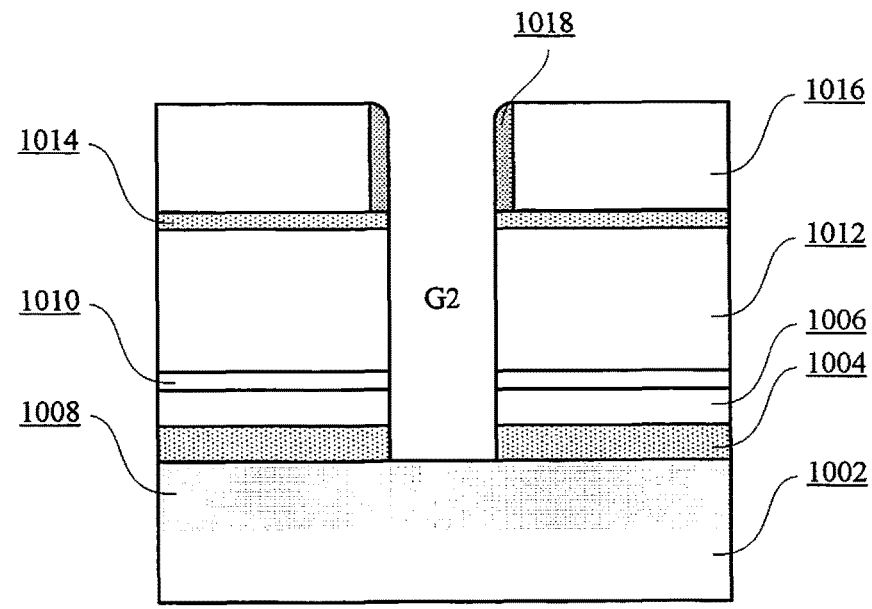

Next, as shown in FIG. 10, the active area may be patterned with the patterning assisting layer 1016 and the pattern transfer layer 1018 as a mask, so as to form a back gate trench therein. Here, RIE may be sequentially performed on the stop layer 1014, the second semiconductor layer 1012, the first semiconductor layer 1010 and the SOI layer 1006. Furthermore, in this example, RIE may be further formed on the buried dielectric layer 1004. Thus, the back gate trench G2 passing through the active area and the buried dielectric layer 1004 may be formed. RIE may stop at the base substrate 1002. Thus, as shown in FIG. 10, the back gate trench G2 may just arrive at the well region 1008. However, the present disclosure is not limited thereto. For example, the back gate trench G2 may also enter into the well region 1008.

Figure 11:
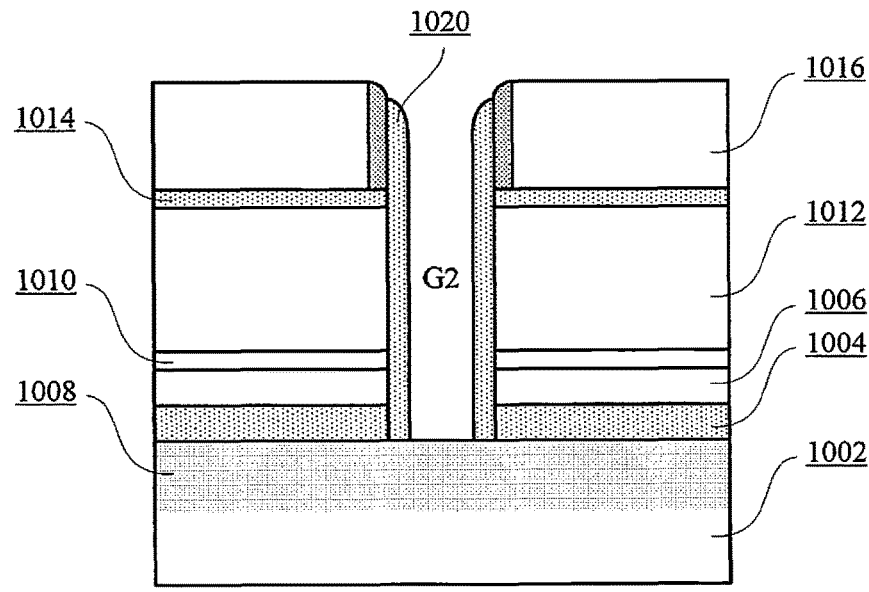

Subsequently, as shown in FIG. 11, back gate dielectric layers 1020 may be formed on side walls of the back gate trench G2. The back gate dielectric layers 1020 may comprise any suitable dielectric material such as oxide. Here, the back gate dielectric layers 1020 may be manufactured in a spacer formation process. For example, a layer of oxide may be deposited on a surface of the structure as shown in FIG. 10, and then RIE may be performed on the oxide to form the back gate dielectric layers as spacer. In this example, the back gate dielectric layer 1020 may have an EOT (Effective Oxide Thickness) substantially identical with that of the buried dielectric layer 1004 (in a case where both of them comprise oxide), e.g., about 2-25 nm.

Figure 12:
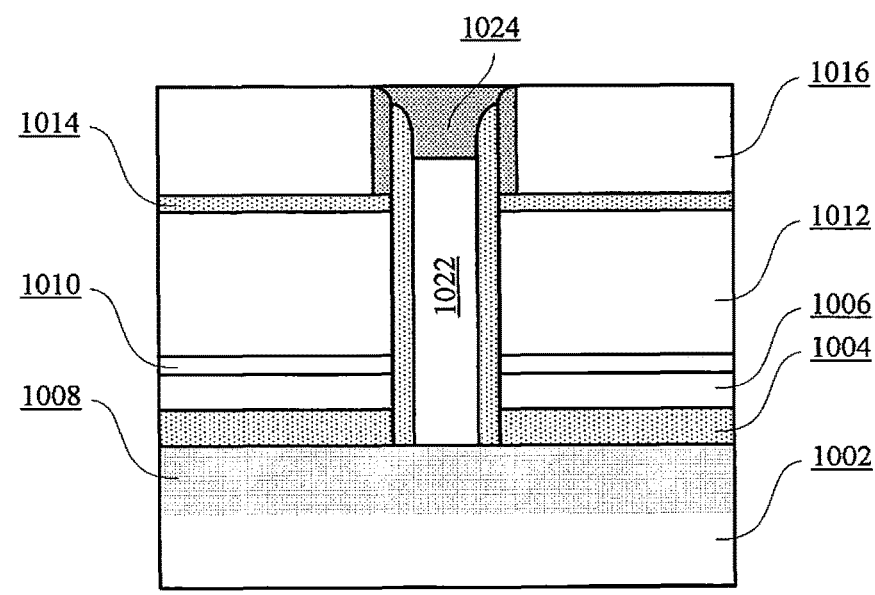

Then, as shown in FIG. 12, a conductive material may be filled in the back gate trench G2 to form a back gate 1022. For example, polysilicon which is doped in-situ or by implantation may be deposited in the back gate trench G2, and then be etched back, to form the back gate 1022. The back gate 1022 may have doping polarity selected for adjusting the threshold voltage of the device. For example, p-type doping may be performed for an n-type device; and n-type doping may be performed for a p-type device. In an example, the back gate 1022 may have a top surface substantially flush with or (slightly) higher than that of the second semiconductor layer 1012 (corresponding to a top surface of the fin portion to be formed later).

In this embodiment, a gate stack crossing over the active area (and the back gate) will be formed subsequently. In order to avoid interference between the back gate 1022 and the gate stack, as shown in FIG. 12, a dielectric layer 1024 may be further filled in the back gate trench G2 to cover the back gate 1022. For example, the dielectric layer 1024 may comprise nitride, and may be formed by depositing nitride and then performing CMP on it.

Figure 13:
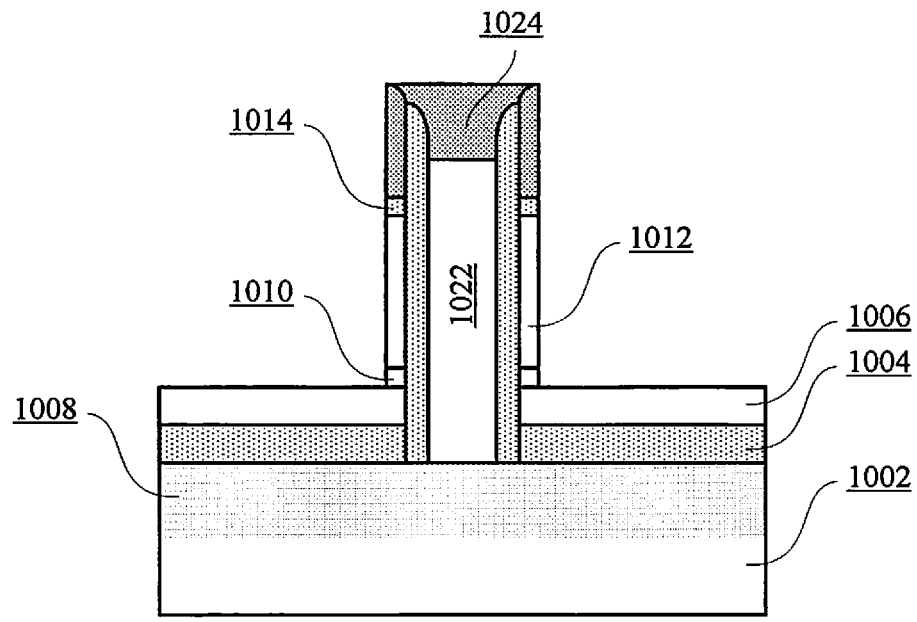

Next, as shown in FIG. 13, the patterning assisting layer 1016 may be removed by selective etching, e.g., by wet etching through TMAH solution, while the pattern transfer layer 1018 may be remained. Then, the stop layer 1014 and the active area may be further selectively etched by, e.g., RIE, with the pattern transfer layer 1018 as a mask. Etching of the active area may stop at the SOI layer 1006. As such, the active area in such a form may be remained on either of opposite sides of the back gate 1022 that the active area comprises the fin portions (1012+1010) and the laterally extending portion (1006). The dielectric layers (1014, 1018) over the fin portions may be selectively removed as required.

Patterning on the opposite sides of the back gate 1022 may be performed differently, to form the active area in other forms. For example, the patterning of the active area on one side may stop at the buried dielectric layer 1004, while the patterning of the active area on the other side may stop at the SOI layer 1006 as described above. As such, the active area may comprise only the fin portion on the one side, while both the fin portion and the laterally extending portion on the other side.

Figure 14:
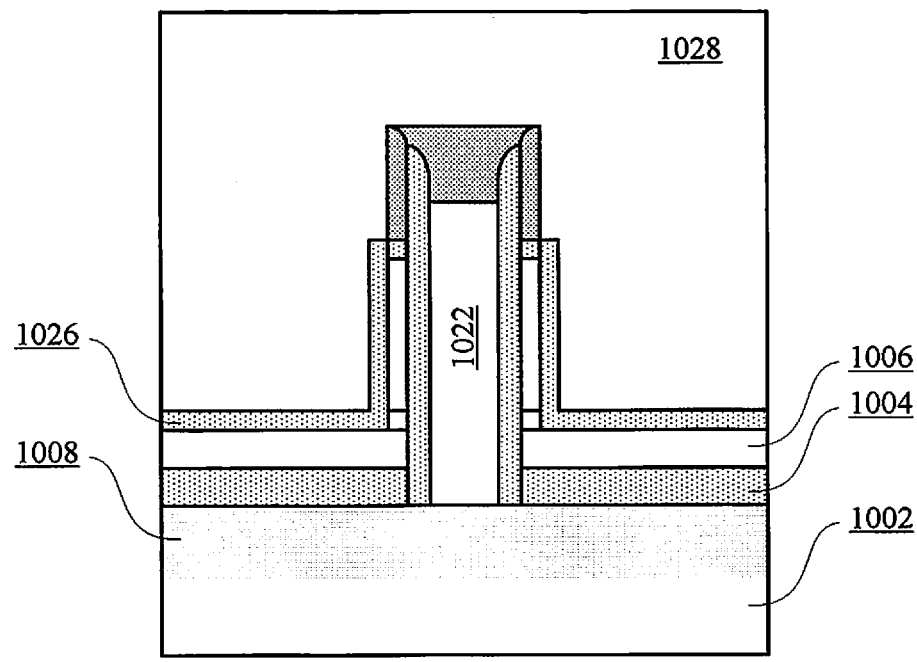

Next, the gate stack may be formed on the active area. For example, this may be done as follows. Particularly, as shown in FIG. 14, a sacrificial gate dielectric layer 1026 may be formed by, e.g., deposition. For example, the sacrificial gate dielectric layer 1026 may comprise oxide with a thickness of about 1-4 nm. In the example as shown in FIG. 14, the gate dielectric layer 1026 is shown as extending only on a surface of the active area for convenience. Then, a sacrificial gate conductor layer 1028 may be formed by, e.g., deposition. For example, the sacrificial gate conductor layer 1028 may comprise polysilicon with a thickness of about 70-150 nm. The sacrificial gate conductor layer 1028 may be planarized by, e.g., CMP.

Figure 15:
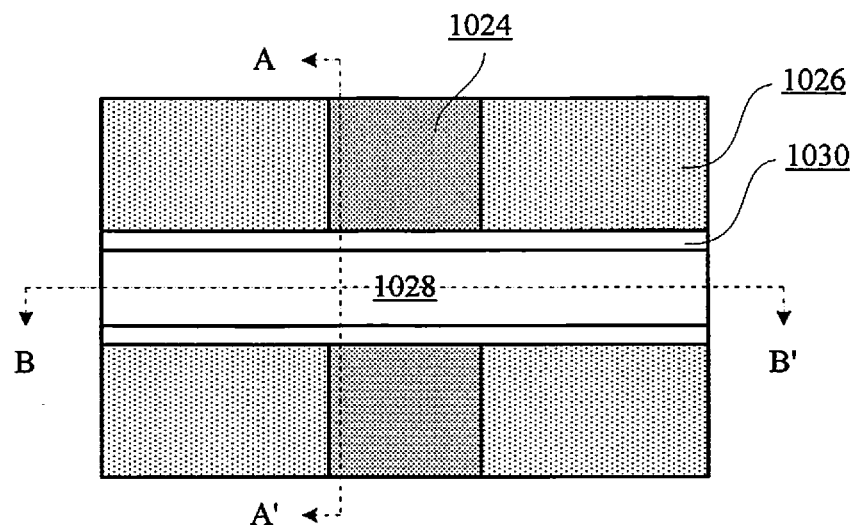

As shown in a top view of FIG. 15, the sacrificial gate conductor layer 1028 may be patterned. In the example of FIG. 15, the sacrificial gate conductor layer 1028 may be patterned into a stripe. According to another embodiment, the sacrificial gate dielectric layer 1026 may be further patterned with the patterned sacrificial gate conductor layer 1028 as a mask, so as to remove portions of the sacrificial gate dielectric layer 1026 on opposite sides of the stripe-type gate conductor layer.

Figure 17:
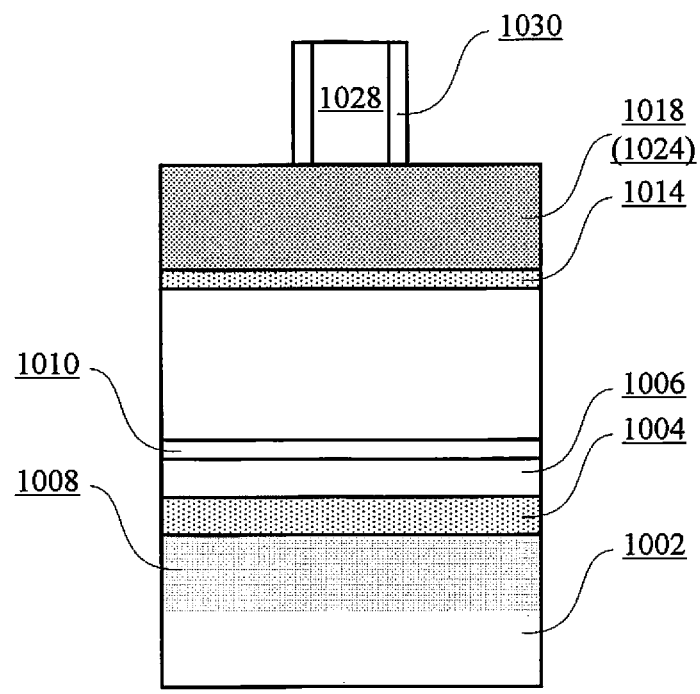

Next, a gate spacer 1030 may be formed on side walls of the sacrificial gate conductor layer 1028. For example, the gate spacer 1030 may be formed by depositing a layer of nitride (e.g., silicon nitride) with a thickness of about 5-15 nm, and then performing RIE on the nitride. Here, amount of RIE may be controlled when forming the gate spacer, so that the gate spacer 1030 has substantially no portion formed on side walls of the fin portions. Those skilled in the art know various ways to form such a spacer, and detailed descriptions thereof will be omitted. FIG. 17 shows a sectional view along line A-A' in FIG. 15.

After the spacer is formed, angular extension implantation may be performed. Further, source/drain (S/D) implantation may be performed with the sacrificial gate conductor and the spacer as a mask. Subsequently, implanted ions may be activated by annealing, so as to form source/drain regions.

Figure 16:
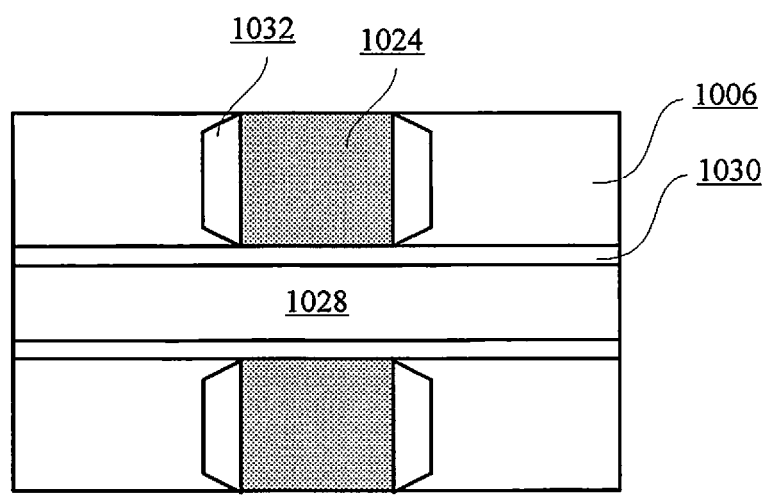

According to one example, in order to improve the performances of the device, the strained source/drain technique may be applied. Particularly, as shown in FIG. 16, a semiconductor layer 1032 may be formed on a surface of exposed parts (substantially corresponding to the source/drain regions) of the active area. According to an embodiment of the present disclosure, the semiconductor layer 1032 may be doped in-situ while being grown. For example, n-type in-situ doping may be performed for an n-type device, and p-type in-situ doping may be performed for a p-type device. Furthermore, in order to further improve the performances, the semiconductor layer 1032 may comprise a material different from that of the active area, so as to apply stress to the active area (especially the channel region to be formed therein). For example, in the example (the active area is mainly made of Si), the semiconductor layer 1032 may comprise Si:C (with an atomic percentage of C of e.g. about 0.2-2%) for an n-type device to apply tensile stress; or SiGe (with an atomic percentage of Ge of e.g. about 20-75%) for a p-type device to apply compressive stress. On the other hand, the grown semiconductor layer 1032 may extend laterally to some extent, thereby facilitating later formation of contacts to the source/drain regions.

In FIG. 16, only the semiconductor layer 1032 is shown as being formed on the side surfaces of the fin portions. However, the present disclosure is not limited thereto. For example, the semiconductor layer 1032 may be formed on the surfaces of the laterally extending portions.

Figure 18:
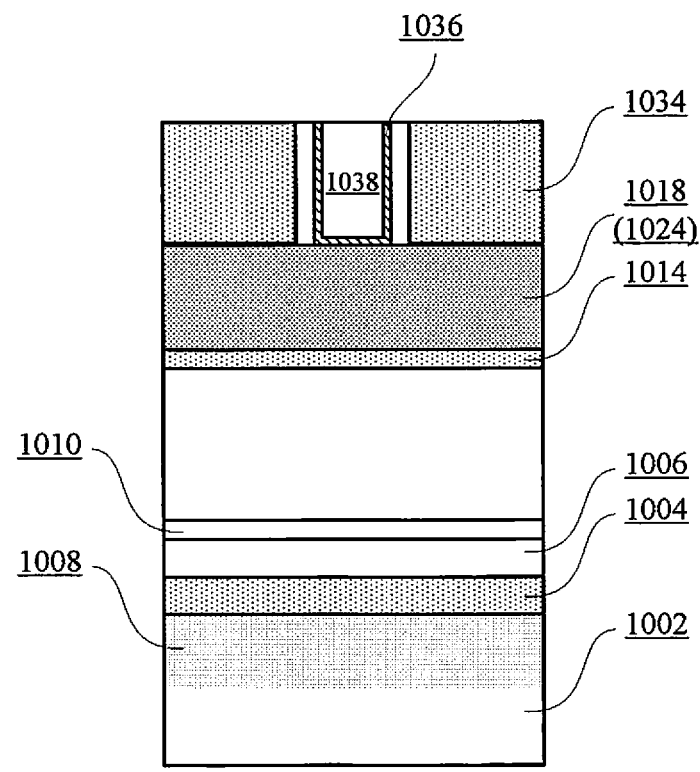

After the source/drain process as shown in FIG. 15 or FIG. 16, a dielectric layer 1034 may be formed by, e.g., deposition, as shown in FIG. 18. The dielectric layer 1034 may comprise e.g. oxide. Subsequently, the dielectric layer 1034 may be planarized by, e.g., CMP. The CMP may stop at the gate spacer 1030, to expose the sacrificial gate conductor layer 1028. Next, the sacrificial gate conductor 1028 may be selectively removed by, e.g., TMAH solution. According to another example, the sacrificial gate dielectric layer 1026 may be further removed. Then, a gate dielectric layer 1036 and a gate conductor layer 1038 may be formed in a trench inside the gate spacer 1030 which is formed due to removal of the sacrificial gate conductor layer and the sacrificial gate dielectric layer, so as to form a final gate stack. The gate dielectric layer 1036 may comprise high-K dielectric such as $HfO_2$ with a thickness of about 1-5 nm. In addition, the gate dielectric layer 1036 may further comprise a thin layer of oxide (on which the high-K dielectric is formed) with a thickness of e.g. 0.3-1.2 nm. The gate conductor layer 1038 may comprise a metal gate conductor. Further, a work function adjustment layer (not shown) may be formed between the gate dielectric layer 1036 and the gate conductor layer 1038.

Figure 19:
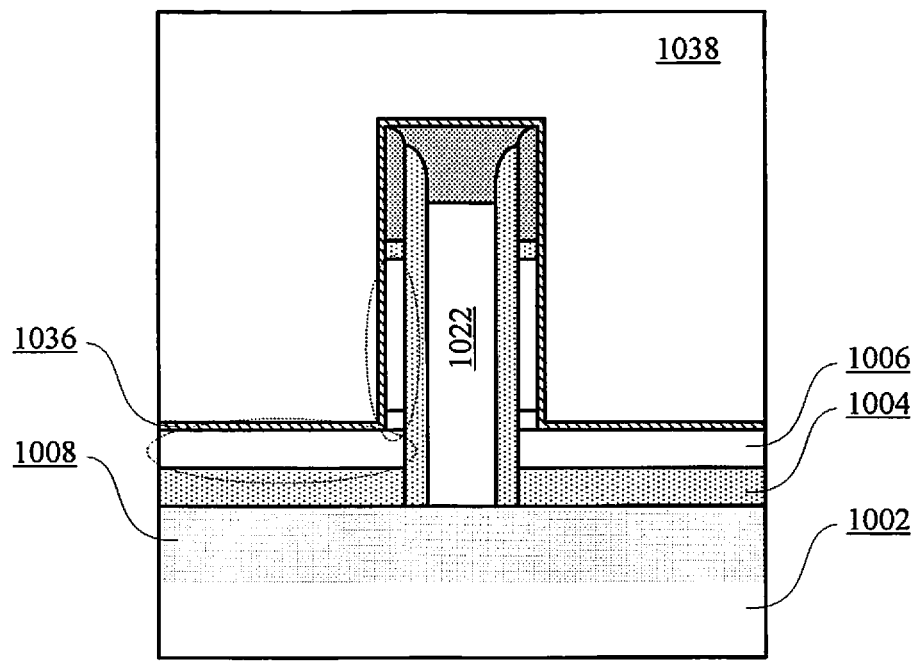

As such, the semiconductor device according to the embodiment is achieved. FIG. 19 shows a sectional view of the semiconductor device along line BB' in FIG. 15. As shown in FIG. 19, in the semiconductor device, the gate stack (including the gate dielectric layer 1036 and the gate conductor layer 1038) intersects with the active area, and thus may define a channel on the side surface of the fin portion and the top surface of the laterally extending portion (as shown by dotted elliptic circles). Therefore, the channel may have a width mainly dependent on the height of the fin portion and the width of the laterally extending portion. Additionally, the back gate 1022 may control the fin portion via the respective back gate dielectric layers 1020, so as to change the threshold of the device as required. The back gate 1022 may be electrically isolated from the gate stack by the dielectric layer 1024.

In the above embodiment, the gate last process is illustrated. However, the present disclosure is not limited thereto. For example, the technique of the present disclosure is also applicable to the gate first process.

Figure 20:
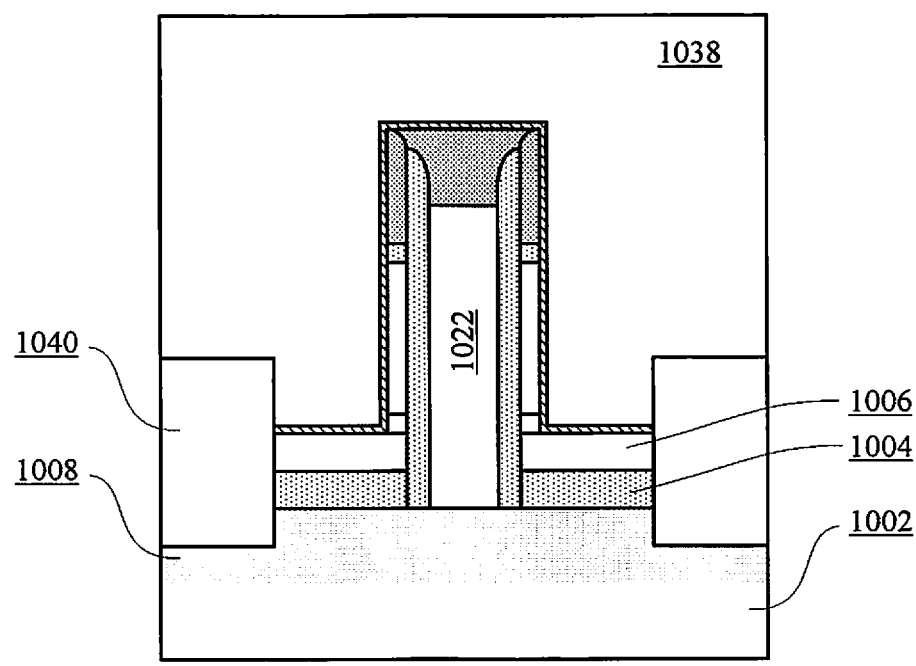
FIG. 20 shows an example in which a width of a laterally extending portion in the semiconductor device of FIG. 19 is defined by STI (Shallow Trench Isolation).

FIG. 20 shows an example in which the width of the laterally extending portion in the semiconductor device of FIG. 19 is defined by STI (Shallow Trench Isolation).

As shown in FIG. 20, STI 1040 may be formed to define the active area (especially its laterally extending portion) of the semiconductor device. For example, the STI 1040 may be formed in the operation of forming the active area as shown in FIG. 6. In particular, after the first and second semiconductor layers are formed, a trench extending into the base substrate 1002 may be formed by selective etching, and then the STI 1040 may be formed by filling the trench with a dielectric material such as oxide. The width of the laterally extending portion may be relatively easy to be adjusted by adjusting the position of the STI 1040, so as to adjust the channel width of the device. Those skilled in the art know various ways to form the isolation portion such as STI, and the detailed descriptions thereof will be omitted.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. Further, many of the elements of one embodiment may be combined with other embodiments Further to or in lieu of the elements of the other embodiments. Accordingly, the technology is not limited except as by the appended claims.

I claim:

1. A semiconductor device, comprising:
   a Semiconductor on Insulator (SOI) substrate, including a base substrate, a buried dielectric layer and an SOI layer;
   an active area disposed on the SOI substrate and including a first sub-area and a second sub-area, wherein the first sub-area comprises a first fin portion, the second sub-area comprises a second fin portion opposite to the first fin portion, and at least one of the first sub-area and the second sub-area comprises a laterally extending portion;
   a back gate arranged between the first fin portion and the second fin portion;
   back gate dielectric layers sandwiched between the back gate and the respective fin portions; and
   a gate stack formed on the active area; and
   wherein the laterally extending portion is formed at least partially from the SOI layer of the SOI substrate, and each of the first fin portion and the second fin portion is formed at least partially from an additional semiconductor layer epitaxially grown on the SOI layer, the additional semiconductor layer comprises one or more layers, and adjacent layers among the one or more layers of the additional semiconductor layer and the SOI layer comprise different materials.

2. The semiconductor device according to claim 1, wherein the laterally extending portion has a lateral extent defined by an isolation portion.

3. The semiconductor device according to claim 1, wherein the SOI substrate comprises an extremely thin (ET)-SOI substrate, and the laterally extending portion is formed from the SOI layer of the ET-SOI substrate.

4. The semiconductor device according to claim 1, wherein the gate stack crosses over a top surface of the active area, and wherein the semiconductor device further comprises a dielectric layer formed on the back gate for isolating the back gate from the gate stack.

5. The semiconductor device according to claim 1, further comprising a well region formed in the base substrate, wherein the back gate passes through the buried dielectric layer to electrically contact with the well region.

6. The semiconductor device according to claim 1, further comprising a further semiconductor layer grown on surfaces of portions of the active area on two opposite sides of the gate stack.

7. A method for manufacturing a semiconductor device, comprising:
   forming an active area on a Semiconductor on Insulator (SOI) substrate, wherein the SOI substrate comprises a base substrate, a buried dielectric layer and an SOI layer;
   forming a back gate trench passing through the active area, to divide the active area into a first sub-area and a second sub-area;
   forming back gate dielectric layers on side walls of the back gate trench;
   filling the back gate trench with a conductive material to form a back gate;
   patterning the active area, so as to form a first fin portion in the first sub-area and a second fin portion in the second sub-area respectively, and to form a laterally extending portion in at least one of the first sub-area and the second sub-area, wherein the first fin portion and the second fin portion are arranged on opposite side walls of the back gate trench respectively; and
   forming a gate stack on the patterned active area; and
   wherein forming the back gate trench comprises:
   forming a patterning assisting layer on the active area, wherein the patterning assisting layer is patterned to have an opening corresponding to the back gate trench;
   forming a pattern transfer layer on side walls of the patterning assisting layer facing the opening;
   etching the active area with the patterning assisting layer and the pattern transfer layer as a mask, to form the back gate trench; and
   wherein patterning the active area comprises:
   selectively removing the patterning assisting layer; and
   etching the active area with the pattern transfer layer as a mask, wherein the etching stops before it arrives at a bottom surface of the SOI layer.

8. The method according to claim 7, wherein forming the active area comprises forming one or more additional semiconductor layers on the SOI layer.

9. The method according to claim 8, wherein patterning the active area comprises:
   selectively etching the one or more additional semiconductor layers sequentially,
   wherein each of the first fin portion and the second fin portion comprises the patterned one or more additional semiconductor layers, and the laterally extending portion comprises the SOI layer.

10. The method according to claim 7, wherein forming the active area further comprises:
    forming an isolation portion on the SOI substrate to define the active area, wherein the laterally extending portion has a lateral extent defined by the isolation portion.

11. The method according to claim 7, further comprising:
    forming a well region in the substrate,
    wherein forming the back gate trench comprises: forming the back gate trench to pass through the buried dielectric layer, so that the back gate formed therein electrically contacts with the well region.

12. The method according to claim 7, wherein after forming the back gate and before patterning the active area, the method further comprises forming a dielectric layer in the back gate trench to cover the back gate.

13. The method according to claim 7, further comprising forming a stop layer on the active area, on which the patterning assisting layer is disposed.

14. The method according to claim 13, wherein the pattern transfer layer comprises nitride, and the stop layer comprises oxide.

15. The method according to claim 7, wherein the pattern transfer layer is formed on the side walls of the patterning assisting layer in a spacer formation process; and/or the back gate dielectric layers are formed on the side walls of the back gate trench in a spacer formation process.

16. A semiconductor device, comprising:
    a Semiconductor on Insulator (SOI) substrate, including a base substrate, a buried dielectric layer and an SOI layer;
    an active area disposed on the SOI substrate and including a first sub-area and a second sub-area, wherein the first sub-area comprises a first fin portion, the second sub-area comprises a second fin portion opposite to the first fin portion, and at least one of the first sub-area and the second sub-area comprises a laterally extending portion;
    a back gate arranged between the first fin portion and the second fin portion;

back gate dielectric layers sandwiched between the back gate and the respective fin portions;
a gate stack formed on the active area; and
a further semiconductor layer grown on surfaces of portions of the active area on two opposite sides of the gate stack.

\* \* \* \* \*